United States Patent
Sekine et al.

(10) Patent No.: US 6,839,264 B2
(45) Date of Patent: Jan. 4, 2005

(54) SEMICONDUCTOR DEVICE WITHOUT ADVERSE EFFECTS CAUSED BY INCLINATIONS OF WORD LINE AND BIT LINE

(75) Inventors: Junichi Sekine, Kawasaki (JP); Kazuteru Ishizuka, Kawasaki (JP)

(73) Assignees: NEC Electronics Corporation, Kanagawa (JP); Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/393,257

(22) Filed: Mar. 21, 2003

(65) Prior Publication Data

US 2003/0235091 A1 Dec. 25, 2003

(30) Foreign Application Priority Data

Mar. 22, 2002 (JP) ........................................ 2002/081838

(51) Int. Cl.[7] ................................................ G11C 5/06
(52) U.S. Cl. ............................................ 365/63; 365/51
(58) Field of Search ..................................... 365/63, 51

(56) References Cited

U.S. PATENT DOCUMENTS 6,031,262 A * 2/2000 Sakao ......................... 257/306
6,094,370 A * 7/2000 Takashima .................. 365/145

FOREIGN PATENT DOCUMENTS

| JP | 08-088162 | 4/1996 |
|---|---|---|
| JP | 09-082710 | 3/1997 |
| JP | 10-135426 | 5/1998 |
| JP | 10-173153 | 6/1998 |

* cited by examiner

Primary Examiner—Richard Elms
Assistant Examiner—Tuan T. Nguyen
(74) Attorney, Agent, or Firm—Young & Thompson

(57) ABSTRACT

The inclination of a word line near asymmetrical contacts is improved by providing an extending portion between the contact and the word line in a DRAM cell array pattern having the asymmetrical contact at an end portion of the word line extending in one direction. The extending portion is provided symmetrically to the word line or is provided on the opposed side of the extending direction of the asymmetrical contact. Alternatively, the extending portion is provided for a bit line as well as the word line.

9 Claims, 7 Drawing Sheets

EXISTING ART

EXISTING ART

EXISTING ART

SEMICONDUCTOR DEVICE WITHOUT ADVERSE EFFECTS CAUSED BY INCLINATIONS OF WORD LINE AND BIT LINE

BACKGROUND OF THE INVENTION

The present invention relates to a semiconductor device which requires fine processing, such as a DRAM.

In general, fine manufacturing processing extremely decreases the margin thereof. This tendency is remarkable in memory devices requiring a large capacitance, such as a DRAM.

An existing DRAM cell array pattern has, e.g., a memory cell area and a dummy cell area provided for an outer peripheral portion of the memory cell area, on the two-dimensional plane. The dummy cell area is arranged vertically and horizontally in the memory cell area. Further, the dummy cell area is arranged to suppress the influence of the disturbance of the shape due to the light-near effect which is caused in the outer peripheral portion of the memory cell area. A word driver portion is arranged outside of each dummy cell area indicated above and below in the memory cell area. On the other hand, a sense amplifier portion is arranged on both right and left sides in the memory cell area.

A contact portion (hereinafter, referred to as a contact portion for a word driver forming the word driver portion) connected to each word driver is connected to a word line extending to the memory area via the dummy cell area. On the other hand, each sense amplifier of the sense amplifier portion is connected to a bit line via the dummy cell area.

If the bit line extends in the X direction and the word line extends in the Y direction, each word driver portion is arranged to both end portions of the word line in the Y direction. An area shared by the contact portion for the word drier and the sense amplifier portion inevitably becomes wider than pitches of the memory cell and the word line.

If the contact portion for the word driver having a symmetrical shape to each word line is arranged only to one end portion in the Y direction, the sharing area of the word driver portion is increased because an interval between the adjacent word drivers is sufficiently assured. Thus, the contact portions for the word driver are alternately arranged to both ends of the work line in the Y direction, that is, an alternate construction is adopted.

In the alternate construction, the contact portion for the word driver is arranged to every other word line at one end portion of the word line. The shape of the contact portion for the word driver arranged upstream of the word line is asymmetrical to the center of each word line in the Y direction, and has a pattern extending to one way.

As a result, the contact portion for the word driver has a portion which is opposed, on the plane, to the end portion of the word line positioned on the left of the word line in the contact portion for the word driver. On the other hand, the shape of the contact portion for the word driver arranged downstream for the word line is asymmetrical to the center of each word line in the Y direction, and has a pattern extending to another way in the shown example. Consequently, the contact portion for the word driver has a portion which is opposed, on the plane, to the end portion of the word line positioned on the right of the word line in the contact portion for the word driver.

In the alternate construction, the entire area of the word driver area is reduced and the word driver areas arranged on the top and the bottom of the memory cell area is designed under a common design rule. As compared with the memory area, with the construction, the pattern is thin in the word driver area. In other words, in the above construction, the pattern density changes to a dense one from a thin one at the end portion of the memory cell array.

In the DRAM cell array pattern, the word lines are arranged in the Y direction via an insulating film on a diffusion layer formed like an island in a semiconductor substrate and, on the other hand, the bit lines are aligned in the X direction via the insulating film on the word lines. Further, a counter-electrode made of polysilicon is arranged to the bit line via an interlayer insulating film. The counter-electrode and the diffusion layer forming a part of the memory cell are electrically connected by a storage node contact of a storage node so as to apply a predetermined capacitance to the memory cell formed to a crossing portion of the word line and the bit line. Further, the bit line is connected to the diffusion layer by bit-line contact.

The storage node contact is formed in a contact hole reaching the diffusion layer formed to the semiconductor substrate near the word line and the bit line. Thus, the word line can be sandwiched by two storage node contacts.

It is observed that the fine patterning and the narrow interval between the word lines cause the end portion of the word line to fall or incline. Further, it is observed in detail that only the word line connected to the contact portion for connecting the word driver falls or is inclined. The word line terminated without connection to the contact portion is not inclined.

The falling or inclining portion of the word line is adjacent to the contact portion. Therefore, a sufficient space does not exist in the storage node contact adjacent to the inclining word line and connected to the contact portion. In the worst status, the opening status is observed. As a consequence, contact resistance in the storage node contact increases and the yield of the DRAM thus deteriorates. This is applied to the bit line as well as the word line.

SUMMARY OF THE INVENTION

Accordingly, it is one object of the present invention to provide a semiconductor device without adverse effects due to the inclinations of a word line and a bit line by finding phenomena thereof and by researching the cause thereof.

Further, it is another object of the present invention to provide a semiconductor device which improves the yield if the manufacturing processing is fine.

Hereinbelow, aspects of the present invention will be described.

According to a first aspect of the present invention, there is provided a semiconductor device comprising a word line, a bit line, and a storage node adjacent to the word line and the bit line. At least one of the word line and the bit line has a planar pattern for preventing the inclination at an end portion of at least one of the word line and the bit line.

According to a second aspect of the present invention, there is provided a semiconductor device comprising a memory cell area including a plurality of memory cells, and two word driver areas for sandwiching the memory cell area from both opposed sides. The memory area comprises a plurality of word lines which extend in a single direction between the two word driver areas, a bit line which extends in the direction crossing to the word line, and a contact portion for the word driver arranged to each of the word driver areas and connected to every other word line, which is asymmetrical to the word line. The device further comprises a planar pattern, for preventing the inclination of the word line caused by the asymmetrical contact portion for the word driver, arranged at a position adjacent to the contact portion for the word driver of the word line.

According to a third aspect of the present invention, there is provided a semiconductor device comprising a memory cell area including a plurality of memory cells, and two word driver areas which sandwiches the memory cell area from both opposed sides. The semiconductor device is manufactured under a design rule for the dimension not larger than 0.15 μm. The memory area comprises a plurality of word lines which extend in a single direction between the two word driver areas, a bit line which extends in the direction crossing to the word line, and a contact portion for the word driver arranged to each of the word driver areas and connected to every other word line. The contact portion for the word driver of the word line has a shape symmetrical to the word line. The semiconductor device thus prevents the inclination of the word line.

According to a fourth aspect of the present invention, there is provided a semiconductor device comprising an electrode wiring and a signal transfer wiring. At least one of the electrode and the signal transfer wirings has a asymmetrical pattern with a shape asymmetrical to an extending direction of the wirings. The device further comprises a planar pattern structured by an extending portion symmetrical to the extending direction of at least one of the electrode and the signal transfer wirings. The device prevents that stress caused by the symmetrical pattern in the manufacturing process of the semiconductor device affects to at least one of the electrode and the signal transfer wirings as an end portion of the planar pattern.

Other objects, features, and advantages of the present invention will be obvious in the following description.

DESCRIPTION OF THE PREFERRED EMBODIMENTS

Figure 1:
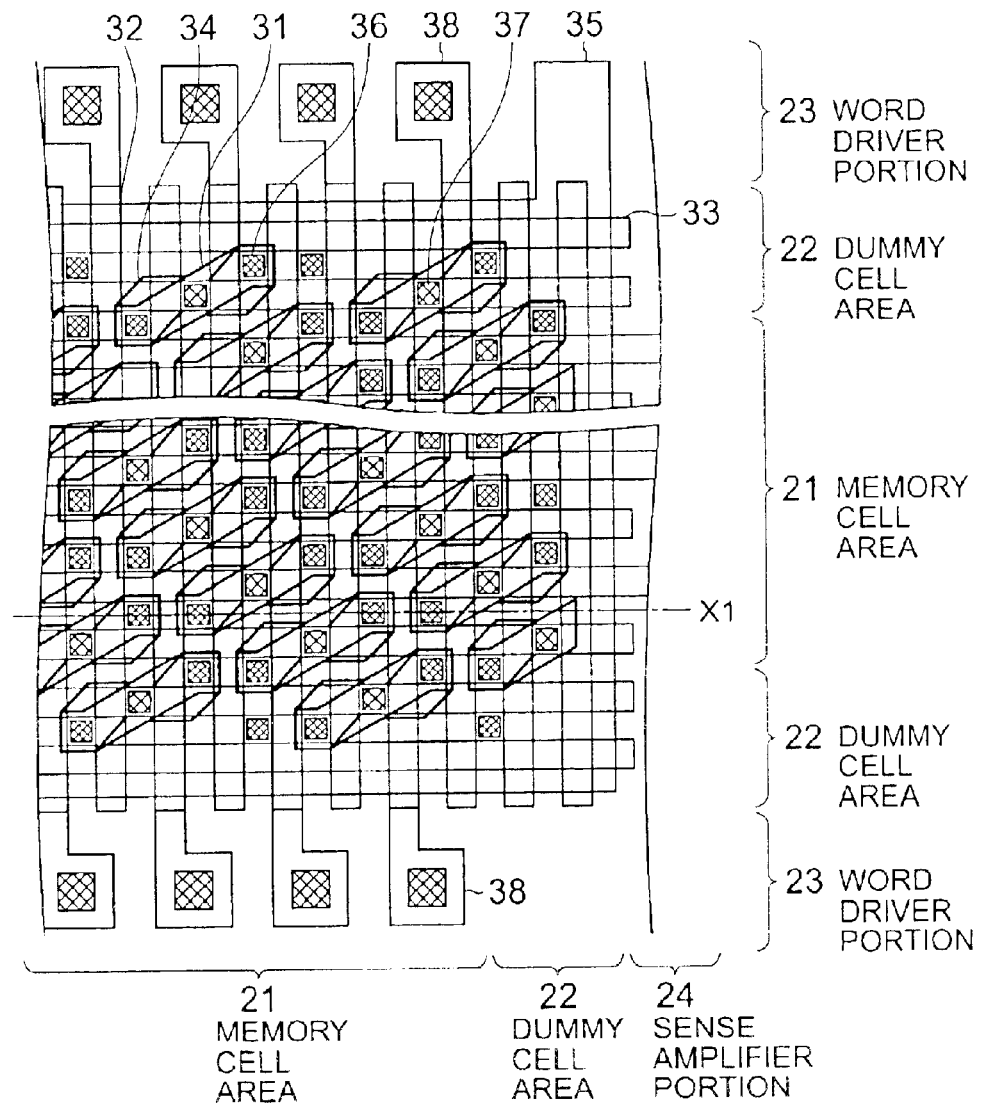
FIG. 1 is a plan view showing an example of a DRAM cell array pattern according to an existing art.

Hereinbelow, a semiconductor device will be described according to embodiments of the present invention.

First, an existing art will be described with reference to FIGS. 1 to 3 for the purpose of clearly understanding the present invention.

A DRAM cell array pattern as an existing art will specifically be described with reference to FIG. 1. The DRAM cell array pattern shown in FIG. 1 two-dimensionally has a memory cell area 21 and a dummy cell area 22 arranged at the outer peripheral portion of the memory cell area 21, and the dummy cell areas 22 shown in FIG. 1 are arranged in the vertical and horizontal directions of the memory cell area 21. The dummy cell areas 22 are arranged so as to suppress the influence of the disturbance of the shape due to the light-near effect which is caused at the outer peripheral portion of the memory cell area 21 as a result of the fine manufacturing processing.

The word driver portions 23 are arranged outside each dummy cell areas 22 above and below shown in FIG. 1. On the other hand, the sense amplifier portion 24 (only that on the right in FIG. 1) is arranged at both end sides on the right and left.

A contact portion (referred to as a contact portion 38 for the word driver) connected to each word driver forming the word driver portion 23 is connected to the word line 32 extending to the memory cell area 21 via the dummy cell area 22. On the other hand, each sense amplifier in the sense amplifier portion 24 is connected to the bit line 33 via the dummy cell area 22. Herein, when the bit line 33 extends in the X direction and the word line 32 extends in the Y direction, it is understood that the word driver portions 23 are arranged at both end portions of the word line 32 in the Y direction.

As shown in FIG. 1, a sharing area of each contact portion 38 for the word driver and the sense amplifier is inevitably wider than a pitch between the memory cell and the word line 32. When the contact portions 38 for the word driver having a symmetric shape to each word line 32 are arranged one at one end portion in the Y direction, the sharing area of the word driver portion 23 becomes large because an interval between the adjacent word drivers is sufficiently wide. Thus, in the example shown in FIG. 1, the contact portions 38 for the word driver are alternately arranged at both ends of the word line 32 in the Y direction, that is, an alternate construction is adopted. In this alternate construction, the contact portion 38 for the word driver is arranged every other word line 32 at one end portion of the word line 32. The shape of the contact portions 38 for the word driver arranged on the top of the word line 32 is asymmetrical to the center of each word line 32 in the Y direction. In the example shown in FIG. 1, the contact portion 38 for the word driver has a pattern extending to the left in FIG. 1. As a result, the contact portions 38 for the word driver have portions which are opposed on the plane to the end portion of the word line 32 positioned on the left of the word line 32 thereof. On the other hand, the shape of the contact portions 38 for the word driver arranged on the bottom of the word line 32 is asymmetrical to the center of each word line 32 in the Y direction. In the example shown in FIG. 1, the contact portion 38 for the word driver has a pattern extending to the right in FIG. 1. As a result, the contact portions 38 for the word driver have portions which are opposed on the plane to the end portion of the word line 32 position to the right of the word line 32 thereof.

With the above alternate construction, the entire area of the word driver area 23 is reduced and the word driver areas 23 arranged on the top and bottom on both end sides of the memory cell area 21 are designed under a common design rule.

As compared with the memory cell area 21, with the construction, the pattern is thin in the word driver area 23.

In other words, in the above construction, the pattern density changes to a dense one from a thin one in the memory cell array and the like.

Figure 2:
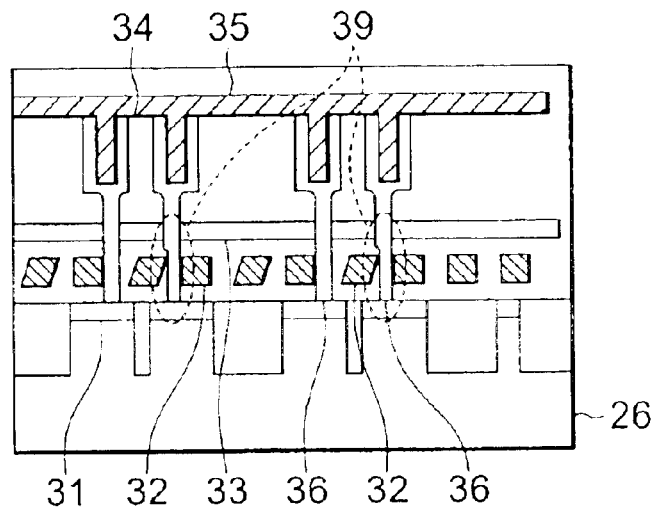
FIG. 2 is a partial cross-sectional view for clarifying problems in the DRAM array pattern shown in FIG. 1.

FIG. 2 shows a cross section along a line X1 of the DRAM cell array pattern shown in FIG. 1. In the DRAM cell array pattern, the word lines 32 are arranged in the Y direction via an insulating film on the diffusion layer 31 formed like an island in the semiconductor substrate 26 and, on the other hand, the bit lines 33 are arranged in the X direction via the insulating film on the word lines 32. Further, a counter-electrode 35 made of polysilicon is arranged onto the bit lines 33 via an interlayer, and is electrically connected to the diffusion layer 31 forming a part of the memory cell by a storage node contact 36 of a storage node 34 so as to apply a predetermined capacitance to the memory cell formed to a crossing portion of the word line 32 and the bit line 33. In addition, the bit line 33 is connected to the diffusion layer 31 by bit line contact 37 (FIG. 1).

The storage node contact 36 is formed in a contact hole extending to the diffusion layer 31 formed to the semiconductor substrate 26 near the word line 32 and the bit line 33. Thus, the word line 32 can be sandwiched by the two storage node contact 36 as shown in FIG. 2.

It is observed that the fine patterning and the narrow interval between the word lines 32 cause the end portion of the word line 32 to fall or incline. Further, it is observed that only the word line 32 connected to the contact portion 38 for connecting the word driver falls or inclines. The word line 32 terminated without connection to the contact portion 38 for the word driver does not incline.

The falling or inclining portion of the word line 32 is adjacent to the contact portion 38 for the word driver shown in FIG. 1. Therefore, a sufficient space does not exist in the storage node contact 36 adjacent to the inclining word line 32 and connected to the contact portion 38, as like to a region encircled by a broken line in FIG. 2. In the worst case, the opening status is observed. As a consequence, a contact resistance in the storage node contact 36 increases and the yield of the DRAM deteriorates. This is applied to the bit line 33 as well as the word line 32.

Figure 3:
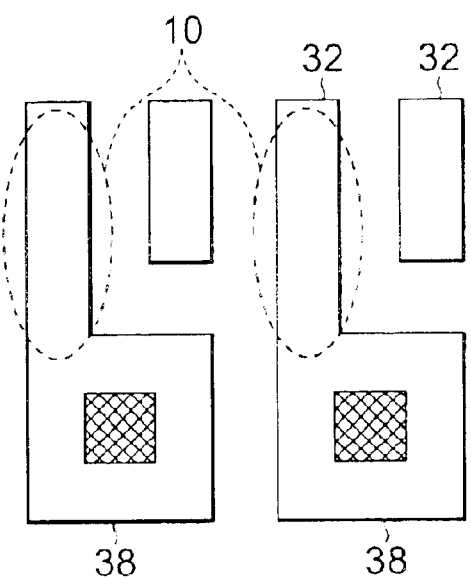
FIG. 3 is a partial plan view for clarifying portions at which the problems are caused in FIGS. 1 and 2.

As mentioned above, in the present invention, it is found that the yield is influenced by the portion in which the pattern density changes from a dense one to a thin one such as the end portion of the memory cell array, namely, the construction of the pattern in a portion 10 shown in FIG. 3, and an improvement against it is proposed.

According to the research of the present inventor, as mentioned above, it is frequently observed in the semiconductor device such as the DRAM that the pattern falls or inclines in the end portion of the memory array. It is further found that the falling and inclination of the pattern in the end portion of the word line depends on the shape of the connecting portion to the word driver. That is, referring to FIG. 1, when the pattern of the contact portion 38 for the word driver connected to the word line 32 is asymmetrical to the extending direction (Y direction) of the word line 32, it is observed that the word line 32 falls or inclines in the extending direction of the contact portion 38 for the word driver. Obviously, the falling and inclination of the pattern is caused by an unbalance status of the shape of the word driver arranged to the outer peripheral portion of the memory cell array, namely, the extending shape of the word driver.

The foregoing will be described in detail with reference to FIG. 3. Referring to FIG. 3, if the word line 32 is connected to the contact portion 38 for the word driver which is asymmetrical to the extending direction of the word line 32, a dotted portion of the word line 32 adjacent to the contact portion 38 for the word driver is pulled toward the extending direction of the contact portion 38 for the word driver (on the right in FIG. 3) due to the unbalance status of the shape as a result of thermal processing after forming the word lines 32 in the manufacturing processing. Further, the word line 32 every other word line 32 inclines at the end portion of the memory cell array. Consequently, referring to FIG. 2, the interval between the word lines 32 is narrow.

In consideration of the above description, according to preferred embodiments of the present invention, a uniform extension is provided for the word line 32 on the side of the connection to the word driver in the dummy cell portion of the memory cell array. Thus, the unbalance status of the contact portion 38 for the word driver does not exert the influence on the inside of the memory cell area. The word line can be connected to the outside word driver within a range of the extension. The size of extension is determined in views of the light-near effect. The similar construction can be applied to the connecting portion between the bit line and the sense amplifier.

Further, according to the research of the present inventor, it is confirmed that the inclination is prevented without adding the uniform extending portion to the word line by forming the shape of the contact portions 38 for the word driver to have patterns which are symmetrical in the Y direction of the word line 32. In this case, the position of the word driver area 23 which vertically sandwiching the contact portion 38 for the word driver extending from the memory area is deviated. The wiring rule in one word driver area is not applied to the wiring rule of the other word driver. However, under a design rule of an interval having 0.15 μm or less, the positional deviation due to the pitch deviation and the enlargement of the area caused by the positional deviation are extremely small.

Hereinbelow, semiconductor devices will be described according to embodiments of the present invention.

First Embodiment

Figure 4:
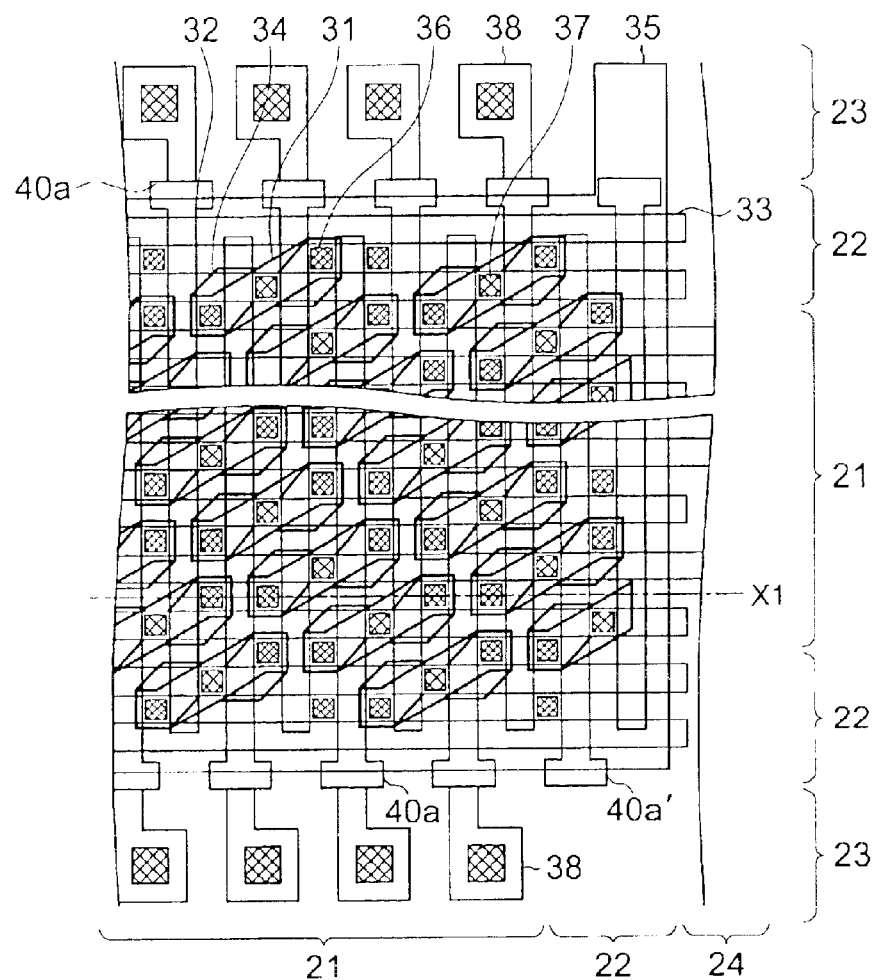
FIG. 4 is a plan view for explaining a DRAM memory cell array pattern according to a first embodiment of the present invention.
Figure 5:
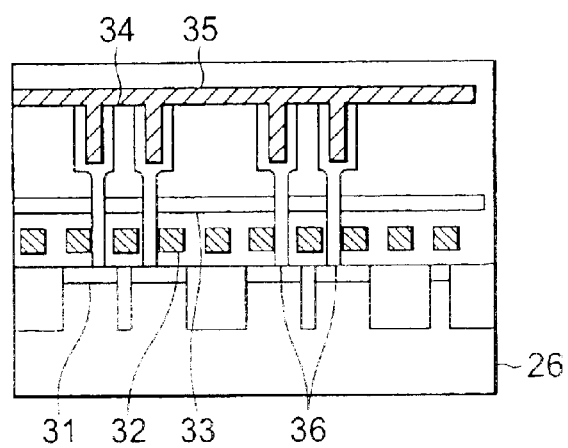
FIG. 5 is a cross-sectional view showing the case in which the DRAM memory cell array pattern is cross-sectional along a line X1 shown in FIG. 4.

A DRAM cell array pattern will be described according to a first embodiment of the present invention with reference to FIGS. 4 and 5. FIG. 4 is a plan view showing the DRAM cell array pattern. FIG. 5 is a cross-sectional view along a line X1 shown in FIG. 4.

Referring to FIGS. 4 and 5, portions corresponding to those according to FIGS. 1 and 2 are designated by the same reference numerals. As will clearly be understood, the DRAM cell array pattern shown in FIGS. 4 and 5 comprises the memory cell area 21, the dummy cell area 22, the word driver portion 23, the sense amplifier portion 24, and the diffusion layer 31 forming a memory cell transistor 31, similarly to that shown in FIG. 1. Further, the DRAM cell array pattern comprises the word line 32, the bit line 33, the storage node contact 36 for connecting a storage node to the diffusion layer 31, the bit line contact 37 for connecting the bit line 33 to the diffusion layer 31, and the contact portion 38 for the word driver that connects the word line 32 to the word driver (not shown). In the word driver portion 23, the single word driver is connected to the two word lines based on the alternate construction. Further, the word driver portion 23 is connected to the word line 32 every other word line via the contact portion 38 for the word driver as shown in FIG. 4.

In the example shown in FIG. 4, the dummy cell area 22 is arranged to the outer peripheral portion of the memory cell area 21. Further, the word driver portion 23 and the sense amplifier portion 24 are arranged to the outside thereof.

As will obviously be understood with reference to FIG. 4, unlike the existing DRAM memory cell array pattern shown in FIGS. 1 to 3 according to the existing art, the DRAM cell array pattern of the present invention has extending portions (that is, planar patterns) 40 which uniformly extend on the right and left of the word line 32 therein at a boundary area between the dummy cell areas 22 and the word drivers 23 on the top and bottom shown in FIG. 4. Namely, the DRAM cell array pattern of the present invention has the extending portions 40 having a symmetric shape with an arbitrary length from the center of the word line 32 is provided therefor on the side of the contact portion 38 for the word driver that is connected to the word driver at the outer peripheral portion of the memory cell area 21 in which the pattern density changes from a thin one to a dense one. The arrangement of the extending portion 40 prevents unbalanced stress to the word line 32 on the memory cell area 21 provided in the extending portion 40.

The extending portion 40 shown in FIG. 4 has a rectangular shape and has two corner projecting portions which are projected to both sides of the word line 32. The two projecting portions extend from the word line 32 by a width which does not have the extension to the adjacent word line 32. In this case, when the projecting width to one side of the word line 32 to the extending portion 40 is equal or narrower than a width of the contact portion 38 for the word driver that connects the word line 32 to the word driver in the X direction, this does not influence on the pitch between the word lines 32. Therefore, with the construction, the arrangement of the extending portion 40 in the word line 32 does not cause the enlargement of the area.

As shown in FIG. 4, only an extending portion 40' having the same shape as that of the extending portion 40 is provided for one end portion of the word line 32 arranged to the dummy cell area 22, and the contact portion 38 for the word driver is not arranged.

As mentioned above, since the size of the extending portion 40 does not influence on the pitch between the word lines 32, it does not exert the influence on the size of the contact portion 38 for the word driver. Consequently, the word driver provided outside from the contact portion 38 for the word driver can be connected without changing the pitch between the word lines 32.

In consideration of the light-near effect in which a mask pattern and a pattern formed by the mask pattern is changed in size, the size of the extending portion 40 is widened at the maximum level within a range of no opening status of the wiring and a range of no short-circuit. For example, in the case of the word line 32 having a width of 0.15 µm and an interval of 0.15 µm, an extension of 0.15 µm may be provided and all the intervals may be 0.15 µm.

As shown in FIG. 4, the uniform extensions are provided on both sides in the extending direction of the word line 32 (Y direction) at the outer peripheral portion of the memory cell area 21. With the construction, as shown in FIG. 4, when the shape of the contact portion 38 for the word driver thereto is not symmetrical to the extending direction of the word line 32, the falling and inclination of the word line 32 are prevented in the thermal processing upon manufacturing processing. The extending portion 40 functions as a bridge beam to the inside memory cell area 21, thereby preventing the falling of the word line 32.

Referring to FIG. 5, it is observed that the inclination of the word line 32 made of polysilicon shown in FIG. 2 is not caused near the contact portion 38 for the word driver. Because the extending portions 40 and 40' as shown in FIG. 4 are provided near the asymmetrical contact portion 38 for the word driver and thus the stress applied to the word line 32 by the asymmetric portion 38 for the word driver is balanced. In consideration thereof, the extending portions 40 are not necessarily provided on both sides of the word line 32 and may be provided in the opposed direction of the extending one of the contact portion 38 for the word driver.

Further, referring to FIG. 5, since the inclination due to the formation of the extending portions 40 and 40' is not caused in the word line 32, the inclination of the word line 32 does not influence on the storage node contact 36 which extends from the storage node 34 to the diffusion layer 31 formed on the semiconductor substrate 26. Therefore, the size of the storage node contact 36 keeps constant and the contact resistance maintains constant.

In the shown pattern, the phenomena of the falling and inclination of the word line 32 are not caused in the memory cell area 21 and therefore the interval between the word lines 32 becomes uniform. With this construction, similarly to the existing art, when the interval between the word lines 32 is narrow, the storage node contact 36 opened between the word lines 32 prevents the default due to connection at high resistance or due to the opening status, which is caused because the desired size of the storage contact 36 is not assured. Consequently, the DRAM memory cell array pattern of the present invention can improve the yield.

Figure 6:
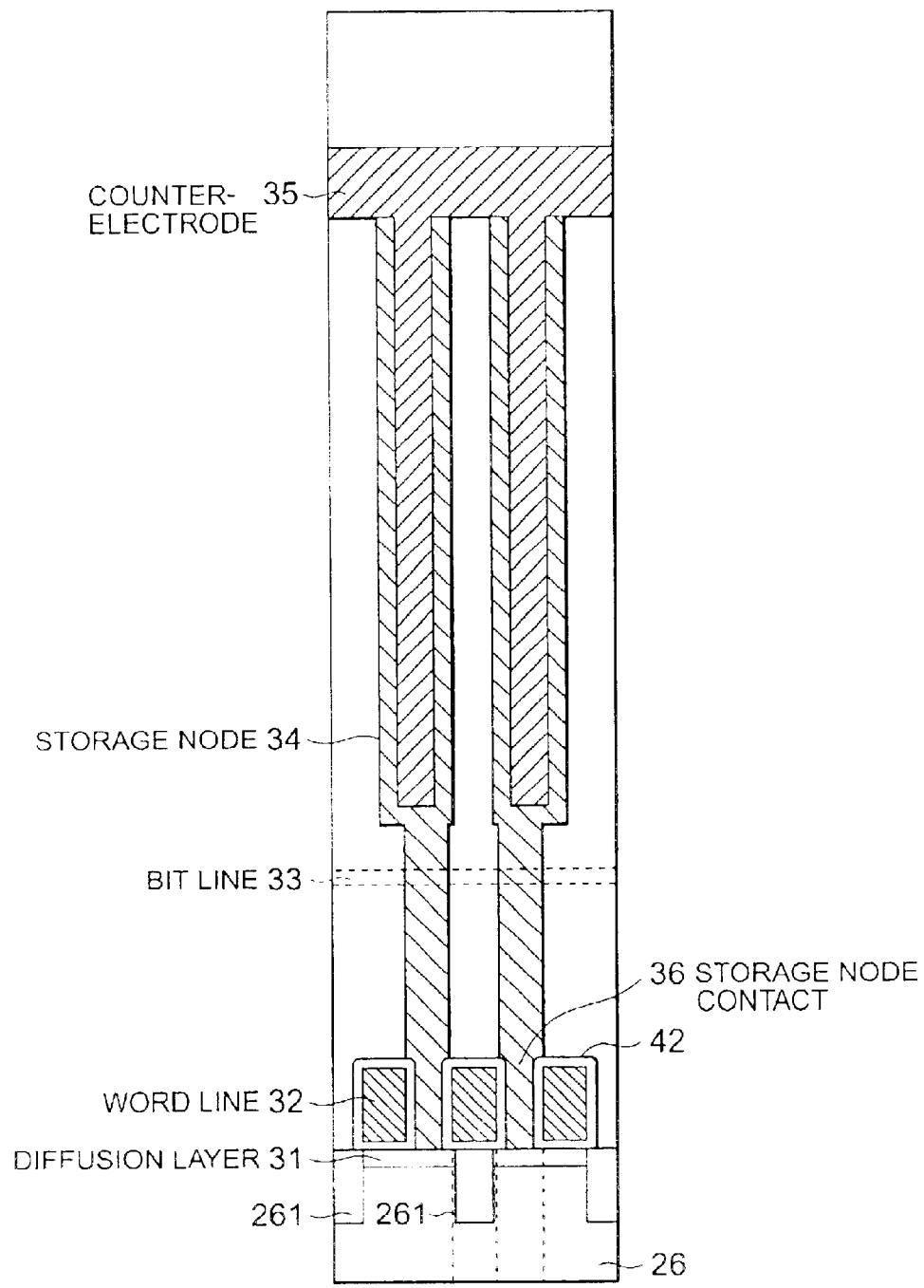
FIG. 6 is a detailed cross-sectional view for specifically explaining FIG. 5.

A description is given of a single memory cell having the structure shown in FIG. 5 as an example with reference to FIG. 6. The semiconductor substrate 26 includes insulating areas 261 by STI (Shallow Trench Isolation). The diffusion layer 31 is formed between the insulating areas 261. In the example shown in FIG. 6, the insulating areas 261 are formed deeper than the diffusion layer 31 in the semiconductor substrate 26.

Similarly to that shown in FIG. 5, the word lines 32 having a predetermined width are aligned at an interval determined by the design rule, and they are covered with insulating films 42. The word lines 32 shown in FIG. 6 are aligned onto the semiconductor substrate 26 in a status in which they are covered with an insulating film having a thickness thinner than that of the word line 32. An insulating film thicker than the insulating film 42 is deposited onto the word line 32. The bit lines 33 arranged in the direction crossing to the word lines 32 are aligned as shown by dotted lines.

Further, a thick interlayer insulating film is provided onto the bit line 33 and has a counter-electrode 35 having a predetermined thickness thereon. The counter-electrode 35 is connected to the diffusion layer 31 via the storage node 34. The counter-electrode 35 is made of polysilicon. With the construction, the storage node 34 is connected to the diffusion layer 31 by the storage node contact 36 extending to an extremely narrow area provided between the word lines 32. The storage node contact 36 is formed by self-alignment. However, since the word lines 32 neither fall nor incline, the storage node contact 36 is accurately formed onto the diffusion layer 31.

Second Embodiment

Figure 7:
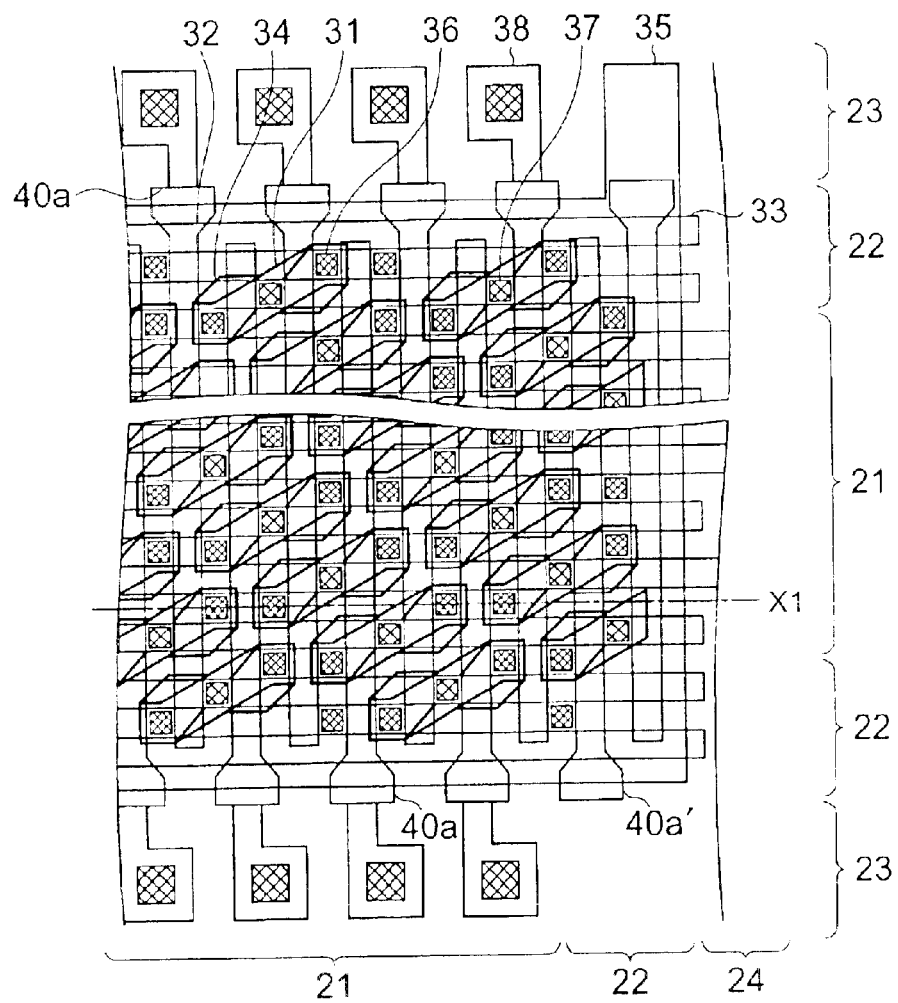
FIG. 7 is a plan view showing a DRAM cell array pattern according to a second embodiment of the present invention.

A description is given of a DRAM cell array pattern according to a second embodiment of the present invention with reference to FIG. 7. The DRAM cell array pattern shown in FIG. 7 is similar to that shown in FIG. 4 except for a point that the shape of the extending portion 40a arranged to the word line 32 is different from that of the extending portion 40 shown in FIG. 4. That is, unlike the rectangular-shaped extending portion 40, the extending portion 40a shown in FIG. 7 is formed like a taper on the side of the memory cell. In consideration of the light-near effect, it is confirmed that the taper-shaped extending portion 40a shown in FIG. 7 is better.

Third Embodiment

Figure 8:
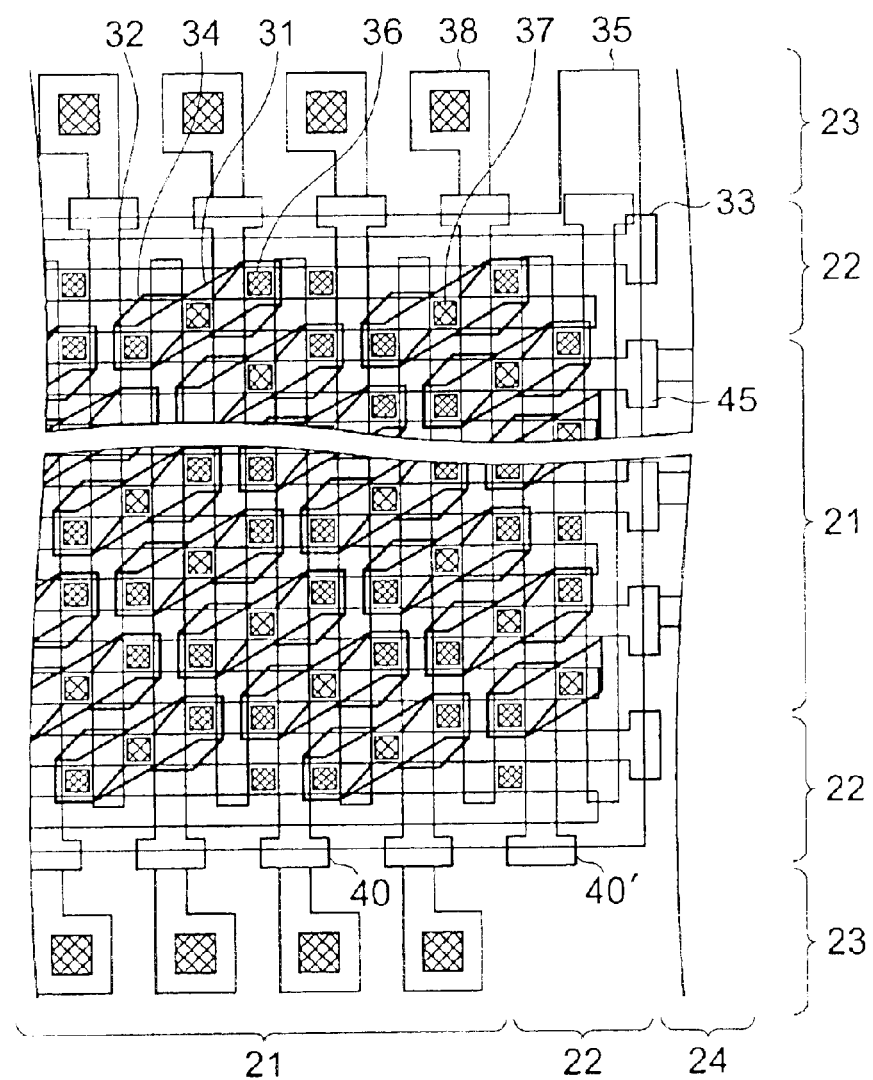
FIG. 8 is a plan view showing a DRAM cell array pattern according to a third embodiment of the present invention.

A description is given of a DRAM cell array pattern according to a third embodiment of the present invention with reference to FIG. 8. The DRAM cell array pattern shown in FIG. 8 is similar to that shown in FIG. 4 except for a point that an extending portion 45 is arranged at an end portion of the bit line 33. In an example shown in FIG. 8, the extending portion 40 is arranged near the contact portion 38 for the word driver of the word line 32 and the extending portion 40' is arranged at the end portion of the word line 32 in the dummy area 22. With this pattern construction, the falling and inclination of the bit line 33 because the storage node contact 36 passes through an interval between the bit lines 33. Therefore, with the pattern construction, the falling and inclination of the bit line 33 as well as the word line 32 are prevented and the storage node contact 36 is more uniformly formed.

The extending portion 45 shown in FIG. 8 is rectangular-shaped symmetrically to the extending direction (X direction) of the bit line 33.

Fourth Embodiment

Figure 9:
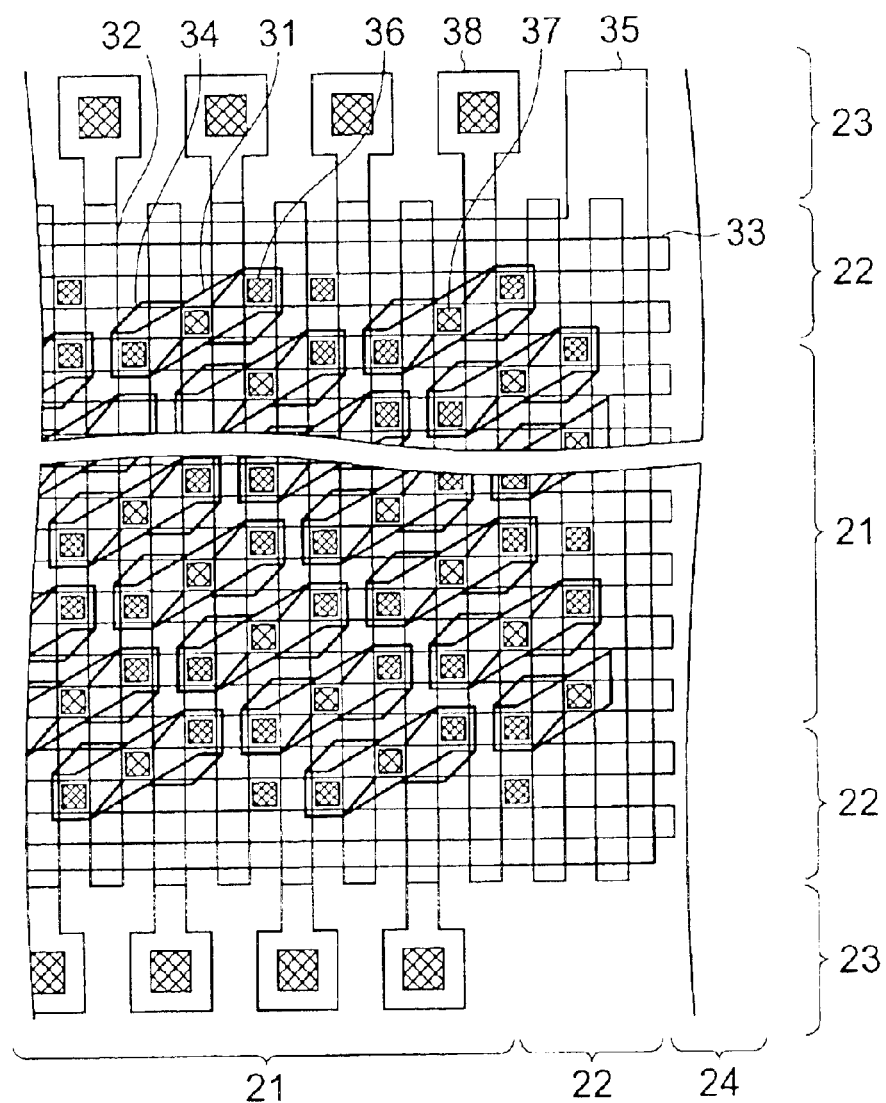
FIG. 9 is a plan view showing a DRAM cell array pattern according to a fourth embodiment of the present invention.

A description is given of a DRAM array pattern according to a fourth embodiment of the present invention with reference to FIG. 9. The DRAM cell array pattern of the present invention uses the design rule that it has a pattern of 0.15 μm or less. Referring to FIG. 9, the word line 32 and the bit line 33 have no extending portion. The contact portions 38 for the word driver that connects the word line 32 thereto are shaped symmetrically in the direction of the word line 32. With this pattern construction, when the dummy cell is not used, the memory cell array end-portion is uniformly shaped.

With the above pattern construction, the word driver portion 23 arranged on the top in FIG. 9 is deviated from the word driver portion 23 arranged on the bottom by the one pitch of the word line 32 on the layout. However, when the pitch of the word line 32 is small, this deviation actually does not become any problem.

The above-explained first to fourth embodiments use the DRAM cell array pattern as the semiconductor device. However, the present invention can apply not only the DRAM cell array pattern but also semiconductor devices such as an SRAM, a ROM, a flash memory, and an MPU, with a multi-layer wiring structure and with the wiring having a pitch of approximately 0.15 μm.

In the semiconductor devices according to the first to fourth embodiments of the invention, as mentioned above, the falling and inclination of the word line are prevented at the end portion of the memory cell array and the space of the storage node contact is ensured. As a consequence, the damage of the bit line is improved at the end portion of the memory cell array and the yield is also improved.

The present invention is explained according to the embodiments. However, the present invention can be embodied according to various modifications by the well-known person. Although only the DRAM is described according to the embodiments, the present invention can be applied to other semiconductor devices such as an SRAM, a ROM, a flash memory, and an MPU having a memory.

What is claimed is:

1. A semiconductor device comprising a word line, a bit line, and a storage node adjacent to said word line and said bit line;
   at least one of said word line and said bit line having a planar pattern extending substantially perpendicular to at least one of said word line and said bit line and extending between at least one of said word line and said bit line and said storage node for preventing inclination at an end portion of at least one of said word line and said bit line.

2. A semiconductor device according to claim 1, wherein said planar pattern provided for at least one of said word line and said bit line is structured by an extending portion having an equal shape on both sides of at least one of said word line and said bit line.

3. A semiconductor device according to claim 2, wherein said extending portion has a rectangular shape.

4. A semiconductor device according to claim 2, wherein said extending portion has a taper shape which is symmetrical on both sides thereof.

5. A semiconductor device according to claim 2, wherein said extending portion is provided at a boundary portion between a dummy cell portion and a contact portion for connecting a word driver.

6. A semiconductor device comprising a memory cell area including a plurality of memory cells and two word driver areas for sandwiching said memory cell area from both opposed sides;
   said memory area comprising:
      a plurality of word lines which extend in a single direction between said two word driver areas;
      a bit line which extends in the direction crossing to said word line; and
      a contact portion for the word driver arranged to each of said word driver areas and connected to every other word line, which is asymmetrical to said word line;
   said device further comprising a planar pattern, for preventing the inclination of said word line caused by said asymmetrical contact portion for the word driver, arranged at a position adjacent to the contact portion for the word driver of said word line between said word line and said contact portion, substantially perpendicular to said word line.

7. A semiconductor device according to claim 6, wherein said asymmetrical contact portion for the word driver has a shape projecting to one side of the corresponding word line;
   said planar pattern having at least an extending portion which extends from said word line to the opposed side.

8. A semiconductor device comprising a memory cell area including a plurality of memory cells, and two word driver areas which sandwiches said memory cell area from both opposed sides;
   said memory area comprising:
      a plurality of word lines which extend in a single direction between said two word driver areas, said semiconductor device structured and arranged so that a width of each of said plural word lines is not larger than 0.15 μm;
      a bit line which extends in the direction crossing to said word line; and
      a contact portion for the word driver arranged to each of said word driver areas and connected to every other word line;

said contact portion for the word driver of said word line having a shape symmetrical to said word line;

said semiconductor device thus preventing the inclination of said word line.

9. A semiconductor device comprising an electrode wiring and a signal transfer wiring;

at least one of said electrode and said signal transfer wirings having an asymmetrical pattern with a shape asymmetrical to an extending direction of said wirings;

said device further comprising a planar pattern comprising a portion symmetrically extending from and substantially perpendicular to an extending direction of at least one of said electrode and said signal transfer wirings;

said device preventing that stress caused by the symmetrical pattern in the manufacturing process of the semiconductor device affects to at least one of said electrode and said signal transfer wirings as an end portion of said planar pattern.

* * * * *